US012648344B2

(12) United States Patent
Lee et al.

(10) Patent No.: US 12,648,344 B2
(45) Date of Patent: Jun. 2, 2026

(54) LIGHT EMITTING DISPLAY APPARATUS INCLUDING BLACK MATRIX HAVING EAVES STRUCTURE

(71) Applicant: LG Display Co., Ltd., Seoul (KR)

(72) Inventors: Joonsuk Lee, Paju-si (KR); DoYoung Kum, Paju-si (KR); Choonghyo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 391 days.

(21) Appl. No.: 18/210,292

(22) Filed: Jun. 15, 2023

(65) Prior Publication Data

US 2024/0180008 A1      May 30, 2024

(30) Foreign Application Priority Data

Nov. 29, 2022    (KR) ........................ 10-2022-0162243

(51) Int. Cl.
*H10K 59/80*      (2023.01)
*H10K 59/122*      (2023.01)
*H10K 59/38*      (2023.01)

(52) U.S. Cl.
CPC ....... *H10K 59/8792* (2023.02); *H10K 59/122* (2023.02); *H10K 59/38* (2023.02)

(58) Field of Classification Search
None
See application file for complete search history.

(56) References Cited

U.S. PATENT DOCUMENTS

| | | | | |
|---|---|---|---|---|
| 2012/0169977 A1* | 7/2012 | Tsubata | ................. | G02B 5/201 |
| | | | | 349/106 |
| 2020/0135811 A1* | 4/2020 | Jung | ........................ | G02B 1/10 |
| 2024/0298509 A1* | 9/2024 | Gong | .................. | H10K 50/865 |
| 2025/0107418 A1* | 3/2025 | Kim | ..................... | H10K 59/878 |

FOREIGN PATENT DOCUMENTS

| | | |
|---|---|---|
| KR | 10-1996-0032023 A | 9/1996 |
| KR | 10-0662781 B1 | 1/2007 |
| KR | 10-2015-0005779 A | 1/2015 |

* cited by examiner

*Primary Examiner* — Nduka E Ojeh
(74) *Attorney, Agent, or Firm* — Birch, Stewart, Kolasch & Birch, LLP

(57) ABSTRACT

A light emitting display apparatus can include a thin film transistor (TFT) substrate and a color filter substrate. The TFT substrate can include a plurality of pixels, where each pixel includes an emission region and a non-emission region. The color filter substrate can include an upper substrate opposite to the TFT substrate, a color filter layer on the upper substrate, and a black matrix dividing the color filter layer. The black matrix can have an eaves structure.

20 Claims, 4 Drawing Sheets

100

LIGHT EMITTING DISPLAY APPARATUS INCLUDING BLACK MATRIX HAVING EAVES STRUCTURE

CROSS-REFERENCE TO RELATED APPLICATIONS

This application claims priority to the Korean Patent Application No. 10-2022-0162243 filed in the Republic of Korea on Nov. 29, 2022, the entire contents of which are hereby expressly incorporated by reference into the present application.

BACKGROUND OF THE DISCLOSURE

Field

The present disclosure relates to a light emitting display apparatus.

Discussion of the Related Art

Light emitting display apparatuses have a high response speed and low power consumption and self-emit light without a separate light source unlike liquid crystal display (LCD) apparatuses. As such, the light emitting display apparatuses are attracting much attention as the next-generation flat display apparatuses.

Light emitting display apparatuses display an image by using light emitted from a light emitting device including an emission layer disposed between two electrodes. At this time, the light emitted from the light emitting device is discharged to the outside through the electrode and a substrate. In the light emitting display apparatuses, a top emission type is being widely used where an image is displayed by using light irradiated toward an upper electrode, based on an opening ratio.

Such light emitting display apparatuses include a thin film transistor (TFT) substrate including a light emitting device, and a color filter substrate which includes a color filter layer and a black matrix dividing the color filter layer.

However, due to the leakage of light, a light emitting display apparatus of a related art can have a limitation in adjusting a line width and a thickness of the black matrix provided in the color filter substrate. Due to this, the light emitting display apparatus of the related art can have an issue where it can be difficult to prevent the occurrence of light leakage and increase an opening ratio of a display panel while having a uniform transmittance.

SUMMARY OF THE DISCLOSURE

Accordingly, the present disclosure is directed to providing a light emitting display apparatus that substantially obviates one or more problems due to limitations and disadvantages of the related art.

An aspect of the present disclosure is directed to providing a light emitting display apparatus in which an opening ratio of a display panel increases while having a uniform transmittance.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus includes a thin film transistor (TFT) substrate including a plurality of pixels with each pixel including an emission region and a non-emission region, and a color filter substrate including an upper substrate opposite to the TFT substrate, a color filter layer on the upper substrate, and a black matrix dividing the color filter layer, wherein the black matrix has an eaves structure.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

In a light emitting display apparatus according to the present disclosure, the occurrence of light leakage can be prevented, and an opening ratio of a display panel can increase while having a uniform transmittance.

In a light emitting display apparatus according to the present disclosure, as an opening ratio of a display panel increases, emission efficiency can increase, and the light emitting display apparatus can be driven with low power.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
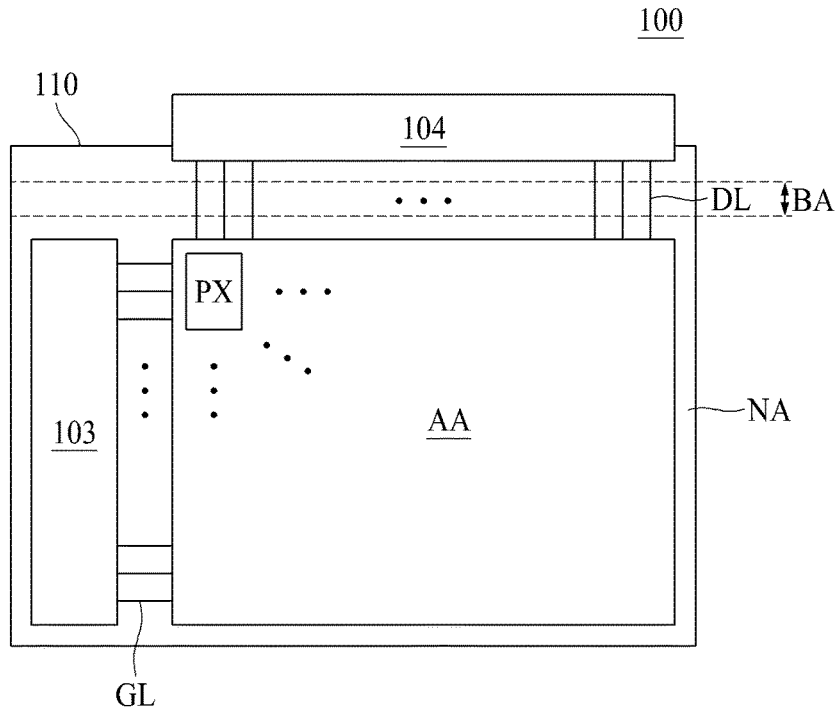
FIG. 1 is a diagram schematically illustrating a light emitting display apparatus according to an example of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part can be added unless "only" is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another, and may not define order or sequence. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of a display apparatus according to the present disclosure will be described in detail with reference to the accompanying drawings. All the components of each display apparatus according to all embodiments of the present disclosure are operatively coupled and configured. In adding reference numerals to elements of each of the drawings, although the same elements are illustrated in other drawings, like reference numerals can refer to like elements. Further, for convenience of description, a scale of each of elements illustrated in the accompanying drawings differs from a real scale, and thus, is not limited to a scale illustrated in the drawings.

FIG. 1 is a diagram schematically illustrating a light emitting display apparatus according to an embodiment of the present disclosure.

Referring to FIG. 1, a display apparatus 100 according to the embodiment of the present disclosure can include a display panel 110. The display panel 110 can include a display area (active area) AA where a plurality of subpixels PX are provided and a non-display area (non-active area) NA which is disposed at a periphery of the display area AA.

The subpixel PX of the display area AA can include a thin film transistor (TFT) which uses an oxide semiconductor material as an active layer.

A plurality of data lines DL and a plurality of gate lines GL can be arranged in the display area AA. For example, the plurality of data lines DL can be arranged in rows or columns, and the plurality of gate lines GL can be arranged in rows or columns. Further, the subpixel PX can be provided in an area defined by the data line DL and the gate line GL.

The plurality of gate lines GL can include a plurality of scan lines and a plurality of emission control lines. The plurality of scan lines and the plurality of emission control lines can transfer different kinds of gate signals (for example, a scan signal and an emission control signal) to gate nodes of different kinds of transistors (for example, a scan transistor and an emission control transistor) disposed in the subpixel PX.

One of a data driver 104 and a gate driver 103 can be disposed in the non-display area NA. Further, the non-display area NA can further include a bending region (bending area) BA where a substrate of the display panel 110 is bent, but embodiments of the present disclosure are not limited thereto. For example, the bending region BA can be provided in the display area AA.

The gate driver 103 can include one or more TFTs which are directly formed on the substrate of the display panel 110. For example, the gate driver 103 can include a TFT including a polycrystalline silicon semiconductor layer, a TFT including an oxide semiconductor layer, or the TFT including the polycrystalline silicon semiconductor layer and the TFT including the oxide semiconductor layer, which are paired. In a case where TFTs respectively disposed in the non-display area NA and the display area AA include the same semiconductor material, the TFTs respectively disposed in the non-display area NA and the display area AA can be simultaneously performed in the same process.

In the TFT including the polycrystalline silicon semiconductor layer and the TFT including the oxide semiconductor layer, electron mobility can be high in a channel, and thus, a high resolution and low power can be implemented.

The gate driver 103 can supply a scan signal having a gate-on voltage to the plurality of gate lines GL sequentially or in a predetermined order, and thus, can drive pixel rows of the display area AA sequentially or in a predetermined order. Here, the gate driver 103 can be referred to as a scan driver. Here, the pixel row can denote a row which is configured with pixels connected to one gate line. As in the display apparatus according to an embodiment of the present disclosure, the gate driver 103 can be implemented as a gate in panel (GIP) type and can be directly disposed on the substrate 110. The gate driver 103 can include a shift register and a level shifter.

The gate driver 103 can include a scan driving circuit which outputs scan signals to a plurality of scan lines corresponding to one kind of the gate line GL and an emission driving circuit which outputs emission control signals to the plurality of emission control lines corresponding to the other kind of the gate line GL.

The display apparatus 100 according to an embodiment of the present disclosure can further include the data driver 104. Further, the data driver 104 can convert image data into analog data voltages, and when a specific gate line is driven by the gate driver 103, the data driver 104 can supply the data voltages to the plurality of data lines DL. The data lines DL can be connected with the data driver 104 through a data pad.

The data line DL can be disposed to pass through the bending region BA, and various data lines DL can be disposed and can be connected with the data driver 104 through a data pad.

The bending region BA can be a region where the substrate of the display panel 110 is bent. The substrate of the display panel 110 can maintain a flat state in a region except the bending region BA.

Figure 2:
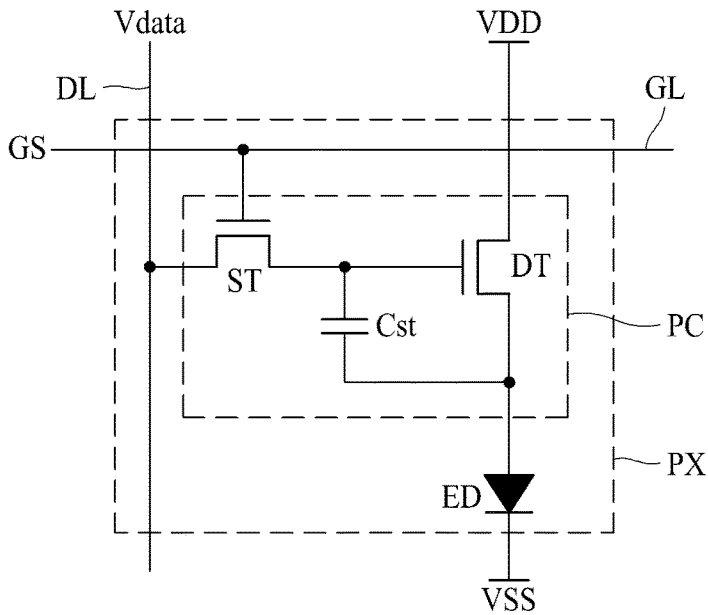
FIG. 2 is an equivalent circuit diagram illustrating an example of a pixel illustrated in FIG. 1.

FIG. 2 is an equivalent circuit diagram illustrating an example of a pixel illustrated in FIG. 1.

Referring to FIG. 2, each subpixel PX of a light emitting display apparatus according to an embodiment of the present disclosure can include a pixel circuit PC and a light emitting device ED.

The pixel circuit PC can be provided in a circuit region of a pixel area defined by a gate line GL and a data line DL and can be connected with an adjacent gate line GL, an adjacent data line DL, and a first driving power source VDD. The pixel circuit PC can control the emission of light from the light emitting device ED with a data voltage Vdata from the data line DL in response to a gate-on signal GS from the gate line GL. The pixel circuit PC according to an embodiment can include a switching TFT ST, a driving TFT DT, and a capacitor Cst.

The switching TFT ST can include a gate electrode connected with the gate line GL, a first source/drain electrode connected with the data line DL, and a second source/drain electrode connected with a gate electrode of the driving TFT DT. The switching TFT ST can be turned on based on the gate-on signal GS supplied through the gate line GL and can supply the data voltage Vdata, supplied through the data line DL, to the gate electrode of the driving TFT DT.

The driving TFT DT can include a gate electrode connected with the second source/drain electrode of the switching TFT ST, a first source/drain electrode (or a drain electrode) connected with the first driving power source VDD, and a second source/drain (or a source electrode) connected with the light emitting device ED. The driving TFT DT can be turned on with a gate-source voltage based on the data voltage Vdata supplied from the switching TFT ST and can control a data signal supplied from the first driving power source VDD to the light emitting device ED.

The capacitor Cst can be connected between the gate electrode and the source electrode of the driving TFT DT, can store a voltage corresponding to the data voltage Vdata supplied to the gate electrode of the driving TFT DT, and can turn on the driving TFT DT with the stored voltage. At this time, the capacitor Cst can maintain the turn-on state of the driving TFT DT until the data voltage Vdata is supplied thereto through the switching TFT ST in a next frame.

The light emitting device ED can be provided in an emission region of the pixel area and can emit light, based on a data signal supplied from the pixel circuit PC. For example, the light emitting device ED can include a first electrode connected with the source electrode of the driving TFT DT, a second electrode connected with a second driving power source VSS, and an emission layer provided between the first electrode and the second electrode. Here, the emission layer can include one of an organic emission layer, an inorganic emission layer, and a quantum dot emission layer, or can include a stack or combination structure of an organic emission layer (or an inorganic emission layer) and a quantum dot emission layer.

As described above, each subpixel PX of the light emitting display apparatus according to an embodiment of the present disclosure can control the data signal supplied to the light emitting device ED with a gate-source voltage of the driving TFT DT based on the data voltage Vdata to allow the light emitting device ED to emit light, thereby displaying a certain image.

Figure 3:
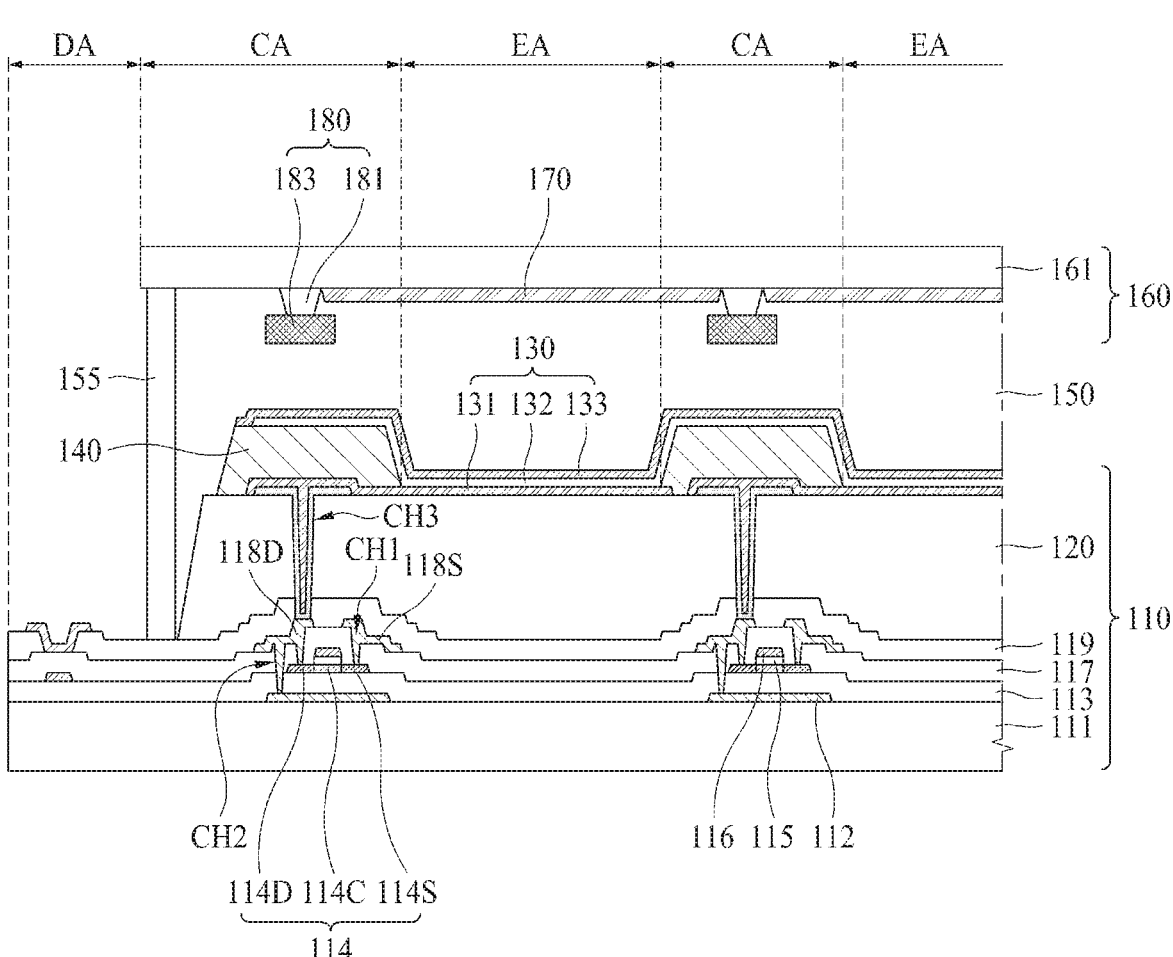
FIG. 3 is a cross-sectional view illustrating a structure of a pixel according to an embodiment of the present disclosure.

FIG. 3 is a cross-sectional view illustrating a structure of a pixel according to an embodiment of the present disclosure.

Referring to FIG. 3, a light emitting display apparatus 100 according to an embodiment of the present disclosure can include a TFT substrate 110 and a color filter substrate 160.

The TFT substrate 110 can include a lower substrate 111, a light blocking layer 112, a buffer layer 113, an active layer 114, a gate insulation layer 115, a gate electrode 116, a lower insulation layer 117, a source electrode 118S and a drain electrode 118D, an upper insulation layer 119, an overcoat layer 120, a light emitting device layer 130, and a bank 140.

The lower substrate 111 can include a plurality of subpixels each including an emission region EA and a non-emission region CA. The lower substrate 111 can include a glass material, but is not limited thereto and can include a transparent plastic material (for example, a polyimide material) capable of being curved or bent. In a case where a plastic material is used as a material of the lower substrate 111, polyimide which is excellent in heat resistance for enduring a high temperature can be used based on that a high temperature deposition process is performed on the lower substrate 111.

The light blocking layer 112 can be provided between the lower substrate 111 and the active layer 114. The light blocking layer 112 can block light which is incident on the active layer 114 through the lower substrate 111, and thus, can minimize or prevent a threshold voltage variation of a transistor caused by external light. Optionally, the light blocking layer 112 can be electrically connected with the drain electrode 118D of a transistor to function as a lower gate electrode of a corresponding transistor, and in this case, can minimize or prevent a threshold voltage variation of a transistor caused by a bias voltage, in addition to a change in characteristic caused by light.

The buffer layer 113 can be provided on the lower substrate 111. The buffer layer 113 can cover all of an upper surface and a lateral surface of the light blocking layer 112. The buffer layer 112 can block the diffusion of a material of the lower substrate 111 to a transistor layer in performing a high temperature process in a manufacturing process of a TFT. Further, the buffer layer 113 can prevent external water or moisture from penetrating into a light emitting device. For example, the buffer layer 113 can include silicon oxide or silicon nitride. For example, the buffer layer 113 can include silicon oxide, silicon nitride, or a structure where silicon oxide and silicon nitride are alternately stacked.

The active layer 114 can be provided on the buffer layer 113. The active layer 114 can be provided in the non-emission region CA of the lower substrate 111. The active layer 114 can include a channel region 114C, and a drain region 114D and a source region 114S provided at both sides of the channel region 114C. For example, the active layer 114 can include the drain region 114D and the source region 114S, which have conductivity based on an etching gas in performing an etching process on the gate insulation layer 115, and the channel region 114C which does not have conductivity. In this case, the drain region 114D and the source region 114S can be disposed apart from each other in parallel with the channel region 114C therebetween. For example, the active layer 114 can include a semiconductor material consisting of one of amorphous silicon, polycrystalline silicon, oxide, and an organic material.

The gate insulation layer 115 can be provided on the channel region 114C of the active layer 114. The gate insulation layer 115 can be formed in an island shape on only the channel region 114C of the active layer 114 and can be formed on a whole front surface of the buffer layer 113 or the lower substrate 111 including the active layer 114.

The gate electrode 116 can be provided on the gate insulation layer 115 to overlap the channel region 114C of the active layer 114. The gate electrode 116 can function as a mask which allows the channel region 114C of the active layer 114 not to have conductivity caused by an etching gas in performing a patterning process of the gate insulation layer 115 by using an etching process. For example, the gate electrode 116 can include molybdenum (Mo), aluminum (Al), chromium (Cr), gold (Au), titanium (Ti), nickel (Ni), neodymium (Nd), copper (Cu), or an alloy thereof and can include a single layer or a two or more-layer multilayer, which includes the metal or alloy.

The lower insulation layer 117 can be provided on the lower substrate 111. The lower insulation layer 117 can be provided on the buffer layer 113 to cover the gate electrode 116. The lower insulation layer 117 can be provided on the gate electrode 116 and the drain region 114D and source region 114S of the active layer 114. For example, the lower insulation layer 117 can include an inorganic material such as silicon oxide (SiOx) or silicon nitride (SiNx). For example, the lower insulation layer 117 can include an organic material such as benzocyclobutene or photo acryl.

The source electrode 118S can be connected with the source region 114S of the active layer 114 through a first contact hole CH1 provided in the lower insulation layer 117 overlapping the source region 114S.

The drain electrode 118D can be electrically connected with the drain region 114D of the active layer 114 through a second contact hole CH2 provided in the lower insulation layer 117 overlapping the drain region 114D of the active layer 114.

The source electrode 118S and the drain electrode 118D can include the same metal material. For example, the source electrode 118S and the drain electrode 118D can include Mo, Al, Cr, Au, Ti, Ni, Nd, Cu, or an alloy thereof and can include a single layer or a two or more-layer multilayer, which includes the metal or alloy.

Additionally, the non-emission region CA can further include a switching TFT and a capacitor. The switching TFT can be provided in the non-emission region CA to have the same structure as that of a driving TFT, and the capacitor can be provided in an overlap region between the gate electrode 116 and the source electrode 118S of the driving TFT overlapping each other with the lower insulation layer 117 therebetween.

The upper insulation layer 119 can be provided all over the lower substrate 111 to cover the TFT. For example, the upper insulation layer 119 can cover the source electrode 118S and the drain electrode 118D of the driving TFT and the lower insulation layer 117. For example, the upper insulation layer 119 can include an inorganic material such as SiOx or SiNx.

The overcoat layer 120 can be provided on the lower substrate 111. The overcoat layer 120 can be provided on the upper insulation layer 119. The overcoat layer 120 can planarize an upper surface of the lower substrate 111 including the TFT. For example, the overcoat layer 120 can include an organic layer such as polyimide or acrylic resin.

The light emitting device layer 130 can be provided on the overcoat layer 120. The light emitting device layer 130 can include a first electrode 131, an emission layer 132, and a second electrode 133.

The first electrode 131 can be provided on the overcoat layer 120. For example, the first electrode 131 can be connected with the drain electrode 118D of the driving TFT through a third contact hole CH3. The third contact hole CH3 can be provided in the overcoat layer 120. For example, the first electrode 131 can be formed in a multi-layer structure which includes a transparent conductive layer and an opaque conductive layer having high reflection efficiency. The transparent conductive layer can include a material, having a relatively large work function value, such as indium-tin-oxide (ITO) or indium-zinc-oxide (IZO), and the opaque conductive layer can include a single-layer or multi-layer structure which includes Al, silver (Ag), Cu, lead (Pb), Mo, Ti, or an alloy thereof. A secondary electrode can be further provided between the first electrode 131 and the overcoat layer 120. The secondary electrode can connect the first electrode 131 with the drain electrode 118D.

The bank 140 can be formed on the overcoat layer 120 to cover one side and the other side of the first electrode 131 of each subpixel. The bank 140 can be a pixel definition layer which defines an emission region of each subpixel. For example, the bank 140 can include an opaque material so as to prevent light interference between adjacent subpixels. In this case, the bank 140 can include a light blocking material including at least one of a colored pigment, organic black, and carbon. The bank 140 can be disposed to correspond to a black matrix 180.

The emission layer 132 can be provided on the first electrode 131. The emission layer 132 can be formed by stacking a hole injection/transport layer, an organic emission layer, and an electron injection/transport layer in order or in reverse order.

The second electrode 133 can be opposite to the first electrode 131 with the emission layer 132 therebetween and can be provided on an upper surface and a lateral surface of the emission layer 132. The second electrode 133 can be provided as one body in a whole surface of an active region. For example, in a case where the second electrode 133 is applied to an organic light emitting display apparatus of a top emission type, the second electrode 133 can include a transparent conductive layer such as ITO or IZO.

The color filter substrate 160 can include an upper substrate 161, a color filter layer 170, and a black matrix 180.

The upper substrate 161 can be provided to be opposite to the lower substrate 111. The upper substrate 161 can include a glass material, but is not limited thereto and can include a transparent plastic material (for example, a polyimide material) capable of being curved or bent. In a case where a plastic material is used as a material of the upper substrate 161, polyimide which is excellent in heat resistance for enduring a high temperature can be used based on that a high temperature deposition process is performed on the upper substrate 161.

The color filter layer 170 can be provided on the upper substrate 161. The color filter layer 170 can be provided in each subpixel of the upper substrate 161. For example, the color filter layer 170 can include a red color filter, a green color filter, and a blue color filter respectively corresponding to subpixels. In an embodiment of the present disclosure, because white light is emitted from a white light emitting device layer 130, the color filter layer 170 which is patterned can be provided for each subpixel, and thus, a color image can be implemented.

The black matrix 180 can be provided on the upper substrate 161. The black matrix 180 can be provided at a boundary between adjacent subpixels. The black matrix 180 can be provided in the non-emission region CA in each subpixel. The black matrix 180 can be provided to correspond to the bank 140. The black matrix 180 can be provided to face the bank 140. For example, a width of the black matrix 180 can be set to be less than that of the bank 140.

The black matrix 180 can be provided between color filters so that lights passing through color filters do not overlap each other or are not mixed. The black matrix 180 can divide an emission region of light passing through the color filter layer 170.

The black matrix according to an embodiment of the present disclosure can have an eaves structure. The eaves structure can be defined as a structure where a roof protrudes over a pillar. Accordingly, the black matrix 180 can include a lower matrix 181 and an upper matrix 183.

The lower matrix 181 can be provided on a first surface of the upper substrate 161 facing the TFT substrate 110. For example, the first surface can be an upper surface of the upper substrate 161. For example, the lower matrix 181 can be provided on an upper surface of the upper substrate 161 facing the lower substrate 111.

The upper matrix 183 can be provided on the lower matrix 181. The upper matrix 183 can contact the lower matrix 181. The upper matrix 183 can have the eaves structure. Accordingly, a width of the upper matrix 183 can be greater than that of the lower matrix 181.

Because the black matrix 180 according to an embodiment of the present disclosure includes the lower matrix 181 and the upper matrix 183 and a width of the upper matrix 183 is greater than that of the lower matrix 181, an end of the color filter layer 170 provided between black matrixes 180 disposed adjacent to each other can be covered by the upper matrix 183. For example, the end of the color filter layer 170 provided between black matrixes 180 disposed adjacent to each other can have a tapered structure.

The black matrix 180 according to an embodiment of the present disclosure can be implemented to have the eaves structure and the end of the color filter layer 170 can be disposed under the upper matrix 183, and thus, can use only a partial region of the color filter layer 170 having a uniform thickness except the end of the color filter layer 170. For example, the partial region can be a region corresponding to the emission region EA. Accordingly, in an embodiment of the present disclosure, a color mixture of the color filter layer 170 can be prevented, and the color filter layer 170 can have a uniform transmittance.

Moreover, in an embodiment of the present disclosure, because the black matrix 180 is configured to have the eaves structure, a thickness of the black matrix can increase, and moreover, a line width thereof can be reduced. Accordingly, a line width of the bank 140 facing the black matrix 180 can be additionally reduced, thereby enhancing an opening ratio of a display panel.

The display apparatus according to an embodiment of the present disclosure can further include a filling layer 150 and a dam 155.

The filling layer 150 can be provided between the TFT substrate 110 and the color filter substrate 160. In a case where the TFT substrate 110 is bonded to the color filter substrate 160, when a separate material is not filled into a separation space between the TFT substrate 110 and the color filter substrate 160, the light emitting display apparatus 100 can be vulnerable to water and oxygen penetrating from the outside thereof. Therefore, the filling layer 150 can be formed in the separation space between the TFT substrate 110 and the color filter substrate 160 and can prevent water and oxygen from penetrating into the display panel. For example, the filling layer 150 can include base resin and getter. The base resin can be a resin composition formed from a binder compound and can disperse getter. The filling layer 150 can be provided on the light emitting device layer 130.

The dam 155 can be provided between the TFT substrate 110 and the color filter substrate 160 in the non-display area CA. The dam 155 can be configured to surround the filling layer 150. The dam 155 can be configured to contact each of the TFT substrate 110 and the color filter substrate 160. The dam 155 can bond the TFT substrate 110 to the color filter substrate 160 to reinforce an adhesive force of the filling layer 150. The dam 155 can prevent the penetration of water and oxygen through a lateral surface of the light emitting display apparatus 100. For example, the dam 155 can be a member which seals elements between the TFT substrate 110 and the color filter substrate 160 and can be referred to as a sealant.

In the following description, only modified elements will be described in detail, and the other elements are referred to by the same reference numerals as FIG. 3 and repeated descriptions thereof are omitted or will be briefly given.

Figure 4:
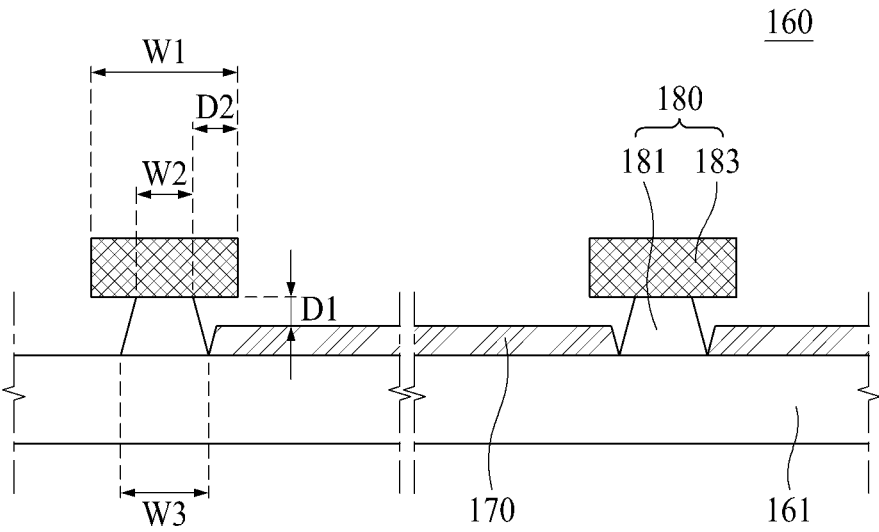
FIG. 4 is a cross-sectional view illustrating an example of a color filter substrate of FIG. 3.

FIG. 4 is a cross-sectional view illustrating a color filter substrate of FIG. 3. FIG. 4 is a cross-sectional view illustrating the color filter substrate illustrated in FIG. 3, and different elements will be described below.

Referring to FIG. 4, a color filter substrate 160 according to an embodiment of the present disclosure can include an upper substrate 161, a black matrix 180, and a color filter layer 170. The color filter layer 170 can be provided on the upper substrate 161 and can be provided for each subpixel. The black matrix 180 can be provided on the upper substrate 161 and can divide the color filter layer 170 disposed for each subpixel. The black matrix 180 can have the eaves structure. To this end, the black matrix 180 can include a lower matrix 181 and an upper matrix 183.

The lower matrix 181 can be provided on an upper surface of the upper substrate 161 facing the TFT substrate 110. For example, the lower matrix 181 can have a tapered structure. For example, the a width W3 of a lower surface of the lower matrix 181 can be about 1 μm or more. For example, a thickness of the lower matrix 181 can be 1 μm or more greater than a thickness of a color filter layer 170, which is thickest, of red (R), green (G), and blue (B) color filter layers 170. For example, the lower matrix 181 can be implemented to be 1 μm or more higher than the color filter layer 170.

Therefore, a lower surface of the upper matrix 183 and the color filter layer 170 formed subsequently thereto can be apart from each other, and the flatness and thickness of the color filter layer 170 corresponding to the emission region EA uncovered by the upper matrix 183 can be uniformly maintained. For example, the lower matrix 181 can include one of an organic material including a black pigment such as carbon black, and a transparent inorganic material or organic material including no black pigment.

The upper matrix 183 can be provided on the lower matrix 181. The upper matrix 183 can contact an upper surface of the lower matrix 181 which is a surface opposite to a lower surface of the lower matrix 181 contacting the upper substrate 161. Accordingly, when the TFT substrate 110 is bonded to the color filter substrate 160, the upper matrix 183 can be disposed closer to the TFT substrate 110 than the lower matrix 181.

For example, a width W1 of the upper matrix 183 can be greater than a width W2 of an upper surface of the lower matrix 181 contacting the upper matrix 183. Further, the width W1 of the upper matrix 183 can be greater than a width W3 of the lower surface of the lower matrix 181 contacting the upper substrate 161. For example, a distance D2 between an end of the upper matrix 183 and an end of the upper surface of the lower matrix 181 can be about 2 μm or more. Accordingly, the lower surface of the upper matrix 183 can be apart from the color filter layer 170, and the flatness and thickness of the color filter layer 170 corresponding to the emission region EA uncovered by the upper matrix 183 can be uniformly maintained.

For example, the upper matrix 183 can have a cross-sectional structure having a rectangular shape, but embodiments of the present disclosure are not limited thereto. For example, the upper matrix 183 can include an opaque metal layer such as chromium (Cr), or can include a black pigment, such as carbon black, or resin and pigments having different colors.

The color filter layer 170 can be provided in a region corresponding to the emission region. For example, the color filter layer 170 can be provided between two adjacent upper matrixes 183 by using the upper matrix 183 as a mask. In this case, the upper matrix 183 including the black pigment can block light of a stepper in a process of forming the color filter layer 170. Therefore, the color filter layer 170 can be implemented to have a tapered shape. For example, the color filter layer 170 can include a negative-type photosensitive material.

The color filter layer 170 can be provided under the lower surface of the upper matrix 183 and the emission region. For example, the color filter layer 170 having a predetermined thickness can be formed in the emission region. For example, the light of the stepper can be blocked by the upper matrix 183 at a portion adjacent to the lower surface of the upper matrix 183, and thus, the color filter layer 170 having a tapered shape can be configured. For example, the color filter layer 170 can be provided under the lower surface of the upper matrix 183 and can be apart from the lower surface of the upper matrix 183. The color filter layer 170 may not contact the upper matrix 183. For example, the color filter layer 170 can have a tapered shape which is gently inclined toward the lower matrix 181 from an end portion of the upper matrix 183. A thickness of the color filter layer 170 can be thinned toward the lower matrix 181 from an end portion of the upper matrix 183. The upper surface of the color filter layer 170 may not contact a lateral surface of the lower matrix 181. For example, an inclined lateral surface of the color filter layer 170 may not contact a lateral surface of the lower matrix 181, but embodiments of the present disclosure are not limited thereto. For example, a separation distance D1 between the lower surface of the upper matrix 183 and the upper surface of the color filer layer 170 can be about 1 μm or more.

In an embodiment of the present disclosure, because the black matrix 180 having the eaves structure is configured, the end of the color filter layer 170 can be provided apart from the lower surface of the upper matrix 183. Further, the end of the color filter layer 170 disposed in the non-emission region can be implemented to have a tapered shape. Accordingly, in an embodiment of the present disclosure, the occurrence of light leakage of the color filter layer 170 can be prevented, a line width of the black matrix 180 can be reduced, and a thickness thereof can increase, and thus, the color filter layer 170 can have a uniform transmittance and an opening ratio of each subpixel can increase.

In an embodiment of the present disclosure, as an opening ratio of a display panel can increase, and thus, emission efficiency can increase, whereby a light emitting display apparatus can be driven with low power.

Figure 5:
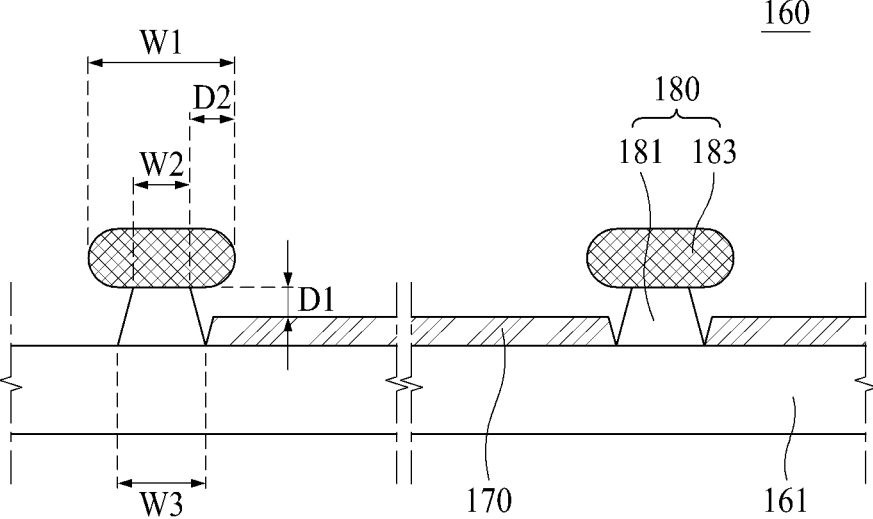
FIG. 5 is a diagram illustrating another example of a black matrix of FIG. 3.

FIG. 5 is a diagram illustrating another embodiment of a black matrix of FIG. 3. FIG. 5 relates to another embodiment of a black matrix, and the other elements except a shape of an upper matrix can be the same as an embodiment described above with reference to FIG. 4. Hereinafter, therefore, different elements will be described.

Referring to FIG. 5, a black matrix 180 according to another embodiment of the present disclosure can have a mushroom structure. A lower matrix 181 can have a tapered structure. An upper matrix 183 can be provided on the lower matrix 181. For example, an end of the upper matrix 183 can be rounded. For example, the end of the upper matrix 183 can include a convex portion which is rounded convexly toward both sides. A width W1 of the upper matrix 183 can be greater than a width W2 of an upper surface of the lower matrix 181. In this case, the width W1 of the upper matrix 183 can be defined as a distance from one end of the upper matrix 183 to the other end of the upper matrix 183. For example, the upper matrix 183 can include a negative-type photosensitive material.

In another embodiment of the present disclosure, because the black matrix 180 having the mushroom structure is configured, the end of the color filter layer 170 can be apart from the lower surface of the upper matrix 183. Further, a thickness of the end of the color filter layer 170 disposed in the non-emission area can be configured to be less than that of the color filter layer 170 disposed in the emission area.

Accordingly, in another embodiment of the present disclosure, the occurrence of light leakage of the color filter layer 170 can be prevented, a line width of the black matrix 180 can be reduced, and a thickness thereof can increase, and thus, an opening ratio of each subpixel can increase while having a uniform transmittance.

Figure 6:
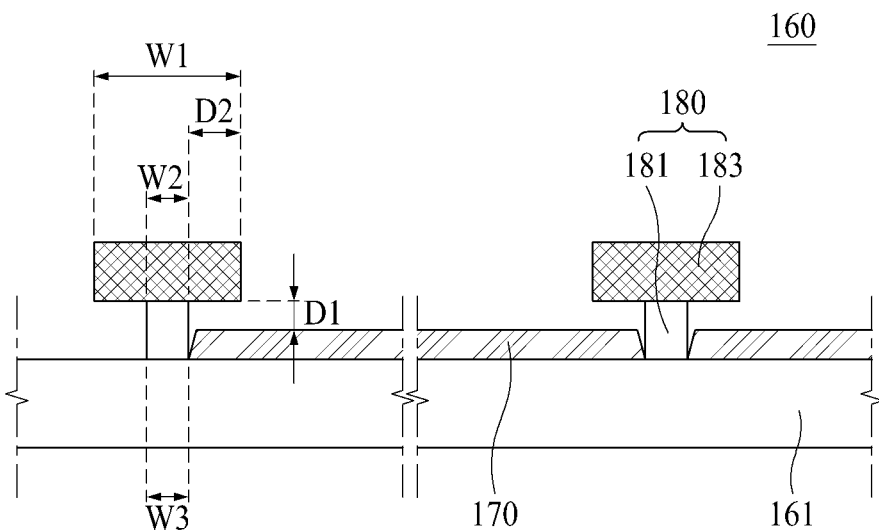
FIG. 6 is a diagram illustrating another example of the black matrix of FIG. 3.

FIG. 6 is a diagram illustrating another embodiment of the black matrix of FIG. 3. FIG. 6 relates to another embodiment of a black matrix, and the other elements except a shape of a lower matrix can be the same as an embodiment described above with reference to FIG. 4. Hereinafter, therefore, different elements will be described.

Referring to FIG. 6, a cross-sectional surface of a lower matrix 181 according to another embodiment of the present disclosure can have a rectangular shape. For example, a width W2 of an upper surface of the lower matrix 181 contacting an upper matrix 183 can be the same as a width W3 of a lower surface of the lower matrix 181 contacting the upper substrate 161. The width W1 of the upper matrix 183 can be greater than the width W2 of the upper surface of the lower matrix 181 and the width W3 of the lower surface of the lower matrix 181.

Accordingly, in another embodiment of the present disclosure, because the black matrix 180 having the eaves structure is configured, the occurrence of light leakage of a display panel can be prevented, a line width of the black matrix 180 can be reduced, and a thickness thereof can increase, and thus, an opening ratio of each subpixel can increase while having a uniform transmittance.

Figure 7:
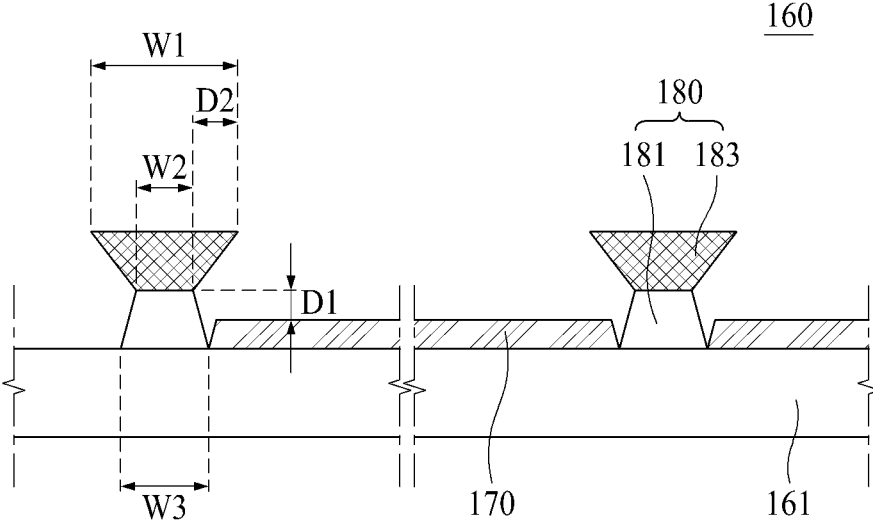
FIG. 7 is a diagram illustrating another example of the black matrix of FIG. 3.

FIG. 7 is a diagram illustrating another embodiment of the black matrix of FIG. 3. FIG. 7 relates to another embodiment of a black matrix, and the other elements except a shape of an upper matrix can be the same as an embodiment described above with reference to FIG. 4. Hereinafter, therefore, different elements will be described.

Referring to FIG. 7, an upper matrix 183 according to another embodiment of the present disclosure can have a reverse tapered structure. The upper matrix 183 can contact an upper surface of a lower matrix 181 which is a surface opposite to a lower surface of the lower matrix 181 contacting an upper substrate 161. Here, a width W1 of the upper matrix 183 can be a width of an upper surface of the upper matrix 183. The upper surface of the upper matrix 183 can be a surface which is opposite to a contact surface contacting the lower matrix 181. Therefore, the width W1 of the upper matrix 183 can be greater than a width W2 of the upper surface of the lower matrix 181 contacting the upper matrix 183. Accordingly, a color filter layer 170 formed subsequently to the upper matrix 183 can be provided between two adjacent upper matrixes 183 by using the upper matrix 183 as a mask.

In another embodiment of the present disclosure, because the black matrix 180 having the eaves structure is configured, an end of the color filter layer 170 can be apart from the lower surface of the upper matrix 183. Further, a thickness of an end of the color filter layer 170 disposed in the non-emission area can be less than that of the color filter layer 170 disposed in the emission region.

Accordingly, in another embodiment of the present disclosure, the occurrence of light leakage of a display panel can be prevented, a line width of the black matrix 180 can be reduced, and a thickness thereof can increase, and thus, an opening ratio of each subpixel can increase while having a uniform transmittance.

A light emitting display apparatus according to the present disclosure can be configured as follows.

A light emitting display according to an embodiment of the present disclosure can include a thin film transistor (TFT) substrate including a plurality of pixels each including an emission region and a non-emission region, and a color filter substrate including an upper substrate opposite to the TFT substrate, a color filter layer on the upper substrate, and a black matrix dividing the color filter layer, wherein the black matrix has an eaves structure.

According to some embodiments of the present disclosure, the black matrix can include a lower matrix at an upper surface of the upper substrate facing the TFT substrate, and an upper matrix on the lower matrix.

According to some embodiments of the present disclosure, the lower matrix can contact the upper matrix.

According to some embodiments of the present disclosure, a width of the upper matrix can be greater than a width of an upper surface of the lower matrix.

According to some embodiments of the present disclosure, a width of the upper matrix can be greater than a width of a lower surface of the lower matrix contacting the upper substrate.

According to some embodiments of the present disclosure, a distance between an end of the upper matrix and an end of an upper surface of the lower matrix can be 2 μm or more.

According to some embodiments of the present disclosure, a lower surface of the upper matrix can be apart from an upper surface of the color filter layer.

According to some embodiments of the present disclosure, a separation distance between the lower surface of the upper matrix and the upper surface of the color filter layer can be 1 μm or more.

According to some embodiments of the present disclosure, a width of a lower surface of the lower matrix can be 1 μm or more.

According to some embodiments of the present disclosure, the lower matrix can have a tapered structure.

According to some embodiments of the present disclosure, the black matrix can have a mushroom structure.

According to some embodiments of the present disclosure, the upper matrix can have a reverse tapered structure.

According to some embodiments of the present disclosure, the upper matrix can include a black pigment such as carbon black.

According to some embodiments of the present disclosure, the lower matrix can include one of an organic material including a black pigment such as carbon black, and a transparent inorganic material or organic material including no black pigment.

According to some embodiments of the present disclosure, the upper matrix can include a negative-type photosensitive material.

According to some embodiments of the present disclosure, the light emitting display apparatus can further include a bank provided in the non-emission region of the TFT substrate to define the emission region.

According to some embodiments of the present disclosure, a width of the black matrix can be less than a width of the bank.

According to some embodiments of the present disclosure, a width of the upper matrix can be less than a width of the bank.

According to some embodiments of the present disclosure, the color filter layer can have a tapered structure.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:

a thin film transistor (TFT) substrate including a plurality of pixels, each of the plurality of pixels including an emission region and a non-emission region; and a color filter substrate including an upper substrate opposite to the TFT substrate, a color filter layer on the upper substrate, and a black matrix dividing the color filter layer, wherein the black matrix comprises:

a lower matrix directly contacting an upper surface of the upper substrate facing the TFT substrate; and an upper matrix on the lower matrix and having an eaves structure with respect to the lower matrix, wherein an end of the color filter layer is covered by a lower surface of the upper matrix, wherein a thickness of the lower matrix is greater than a thickness of a thickest portion of the color filter layer, and wherein the lower surface of the upper matrix and the end of the color filter layer face each other with a gap space therebetween.

2. The light emitting display apparatus of claim 1, further comprising:

a filling layer provided between the TFT substrate and the color filter substrate, wherein the lower matrix is disposed between the upper surface of the upper substrate and the upper matrix, and wherein the filling layer is configured to surround the upper matrix and fill the gap space.

3. The light emitting display apparatus of claim 2, wherein the lower matrix contacts the upper matrix.

4. The light emitting display apparatus of claim 2, wherein a width of the upper matrix is greater than a width of an upper surface of the lower matrix.

5. The light emitting display apparatus of claim 2, wherein a width of the upper matrix is greater than a width of a lower surface of the lower matrix contacting the upper substrate.

6. The light emitting display apparatus of claim 5, wherein a distance between an end of the upper matrix and an end of an upper surface of the lower matrix is about 2 μm or more.

7. The light emitting display apparatus of claim 2, wherein the lower surface of the upper matrix is spaced apart from an end of the upper surface of the color filter layer.

8. The light emitting display apparatus of claim 7, wherein a separation distance between the lower surface of the upper matrix and the end of the upper surface of the color filter layer is about 1 μm or more.

9. The light emitting display apparatus of claim 2, wherein a width of a lower surface of the lower matrix is about 1 μm or more.

10. The light emitting display apparatus of claim 2, wherein the lower matrix has a tapered structure.

11. The light emitting display apparatus of claim 1, wherein the black matrix has a mushroom structure.

12. The light emitting display apparatus of claim 2, wherein the upper matrix has a reverse tapered structure.

13. The light emitting display apparatus of claim 2, wherein the upper matrix comprises a black pigment.

14. The light emitting display apparatus of claim 2, wherein the lower matrix comprises one of an organic material including a black pigment, and a transparent inorganic material or organic material including no black pigment.

15. The light emitting display apparatus of claim 13, wherein the black pigment is carbon black.

16. The light emitting display apparatus of claim 2, wherein the upper matrix comprises a negative-type photosensitive material.

17. The light emitting display apparatus of claim 2, further comprising a bank provided in the non-emission region of the TFT substrate to define the emission region.

18. The light emitting display apparatus of claim 17, wherein a width of the black matrix is less than a width of the bank.

19. The light emitting display apparatus of claim 17, wherein a width of the upper matrix is less than a width of the bank.

20. The light emitting display apparatus of claim 1, wherein the end of the color filter layer has a tapered structure.

* * * * *